United States Patent [19]
Schutten et al.

[11] Patent Number: 4,571,512
[45] Date of Patent: Feb. 18, 1986

[54] LATERAL BIDIRECTIONAL SHIELDED NOTCH FET

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[21] Appl. No.: 390,479

[22] Filed: Jun. 21, 1982

[51] Int. Cl.⁴ .................................... H03K 17/689
[52] U.S. Cl. .................................. 307/577; 307/584; 357/23.4; 357/23.8; 357/23.14; 357/39; 357/41; 357/43; 357/55; 357/86
[58] Field of Search ...... 357/23 UD, 23 MG, 23 HU, 357/54, 55, 86, 23.4, 23.8, 23.14, 41, 43; 307/577, 584

[56] References Cited

U.S. PATENT DOCUMENTS

| | | | |
|---|---|---|---|
| 3,798,514 | 3/1974 | Hayashi et al. | 357/23 UD |
| 4,152,714 | 5/1979 | Hendrickson et al. | 357/23 UD |
| 4,199,774 | 4/1980 | Plummer | 357/23 UD |
| 4,243,997 | 1/1981 | Natori et al. | 357/23 UD |
| 4,364,074 | 12/1982 | Garnache et al. | 357/23 UD |

FOREIGN PATENT DOCUMENTS 55-95366  7/1980  Japan ............................ 357/23 UD

OTHER PUBLICATIONS

"A Parametric Study of Power MOSFET", C. Hu, IEEE Electron Device Conference; Paper CH 1461-3/79, 0000-0385.
"UMOS Transistors on (110) Silicon", Ammar & Rogers, Transactions IEEE; ED-27; May, 1980; pp. 907-914.
"Optimum Doping Profile for Minimum Ohmic Resistance and High Breakdown Voltage", C. Hu; IEEE Transactions Electron Devices; vol. Ed-26; 1970; pp. 243-244.
J. Tihany; "Funct. Integ. of Power MOS and Bipolar Dev.," Proc. 1980 IEEE IEDM, Dec. 1980, pp. 75-78.
P. Ou-Yang, "Double Ion-implanted V-MOS Tech.," IEEE J. of S.-S. CRTS, vol. SC-12#1, Feb. 1977, pp. 3-10.
H. Lee et al., "Short-channel FETs In-grooves", IBM Tech. Discl. Bull., vol 22#8B, Jan. 1980, pp. 3630-3634.

Primary Examiner—Joseph E. Clawson, Jr.
Attorney, Agent, or Firm—Andrus, Sceales, Starke & Sawall

[57] ABSTRACT

Lateral FET structure is disclosed for bidirectional power switching, including AC application. Voltage blocking capability is substantially increased by a shielding electrode insulated between first and second gate electrodes in a notch between laterally spaced source regions and channel regions joined by a common drift region around the bottom of the notch. The shielding electrode prevents the electric field gradient toward the gate electrode on one side of the notch from inducing depletion in the drift region along the opposite side of the notch. This prevents unwanted inducement of conduction channels in the drift region during the OFF state of the FET. High density, high voltage, plural FET structure is disclosed.

11 Claims, 17 Drawing Figures

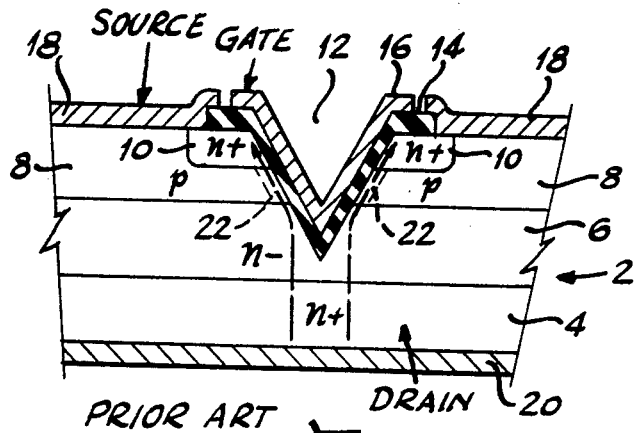
Fig. 1 VMOS FET PRIOR ART
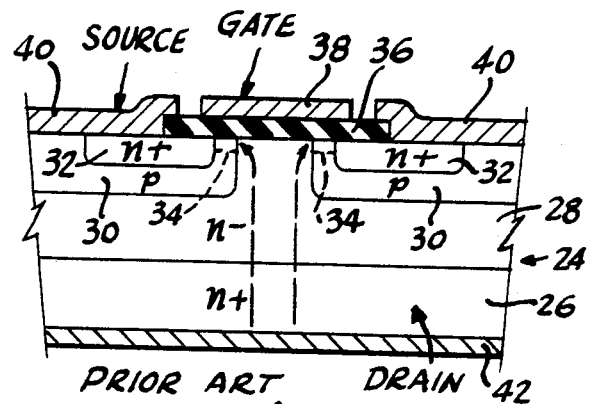
Fig. 2 DMOS FET PRIOR ART
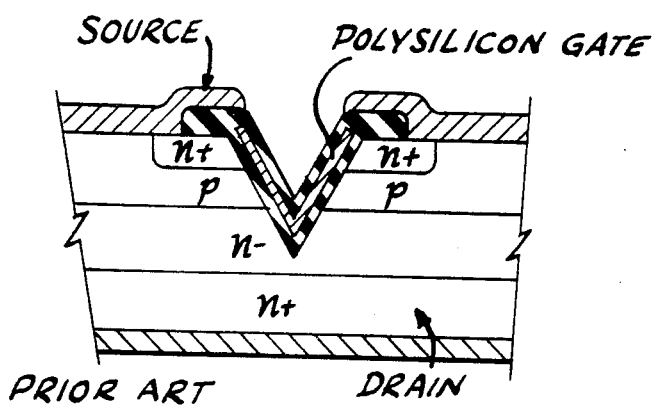
Fig. 3 VMOS WITH POLY-SI GATE PRIOR ART

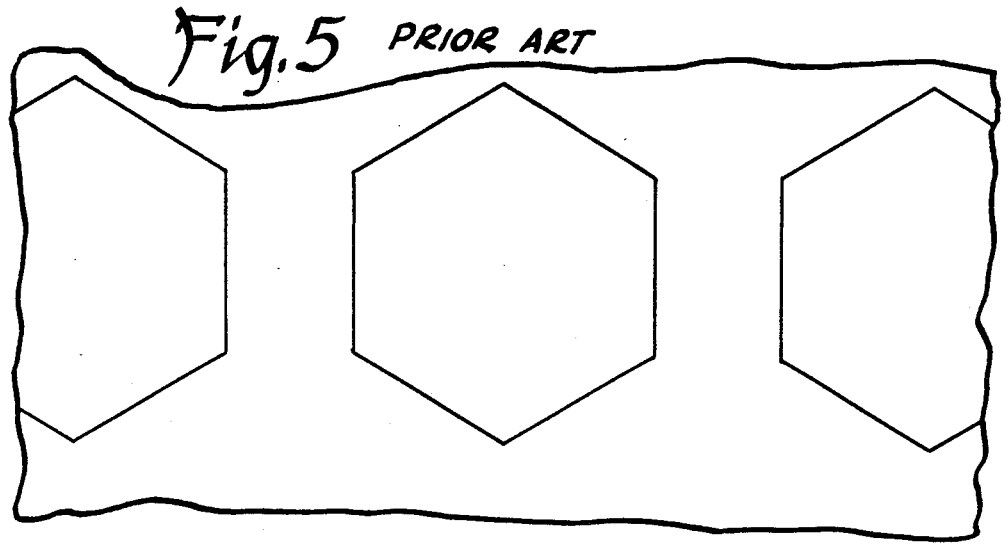
Fig. 5 PRIOR ART
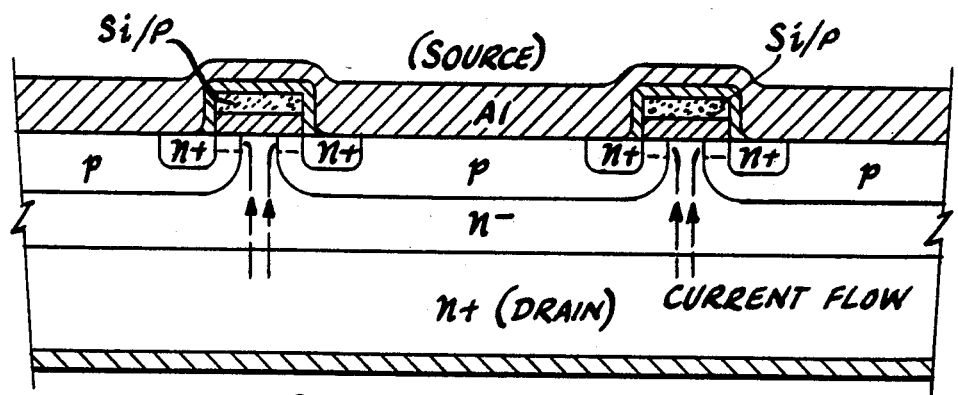
Fig. 4 PRIOR ART DMOS WITH POLY-SI GATE (HEX FET)
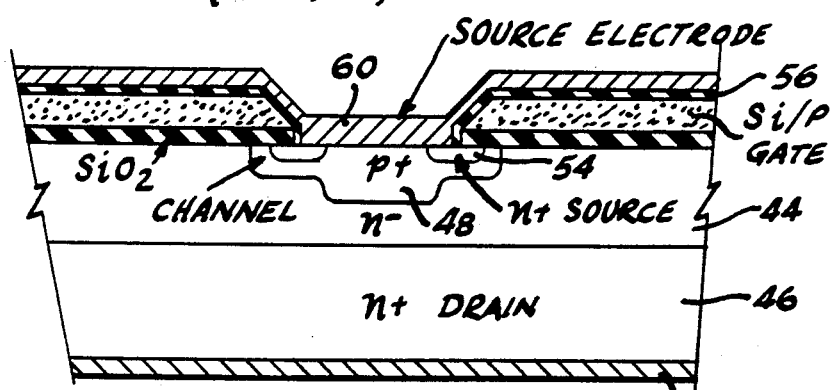
Fig. 6 PRIOR ART SIPMOS FET

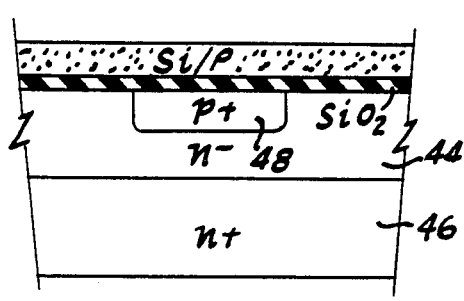
Fig. 7 PRIOR ART
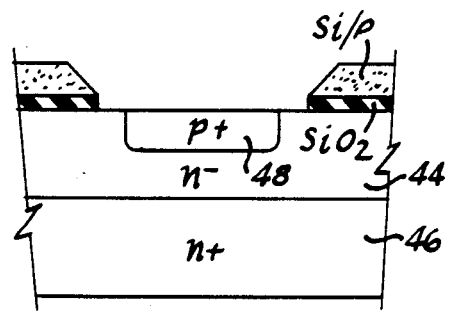
Fig. 8 PRIOR ART
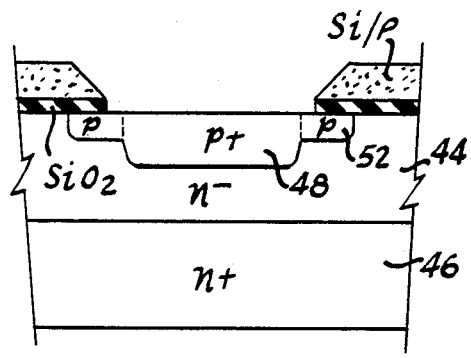
Fig. 9 PRIOR ART
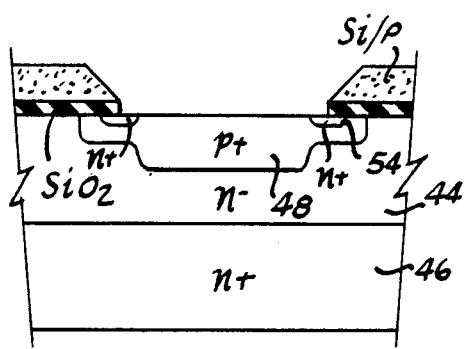
Fig. 10 PRIOR ART
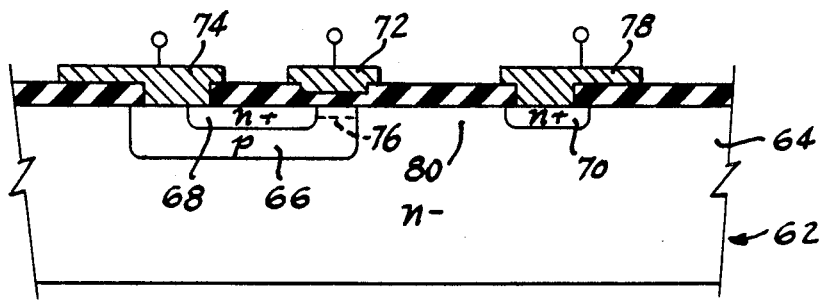
Fig. 11 PRIOR ART LATERAL MOSFET

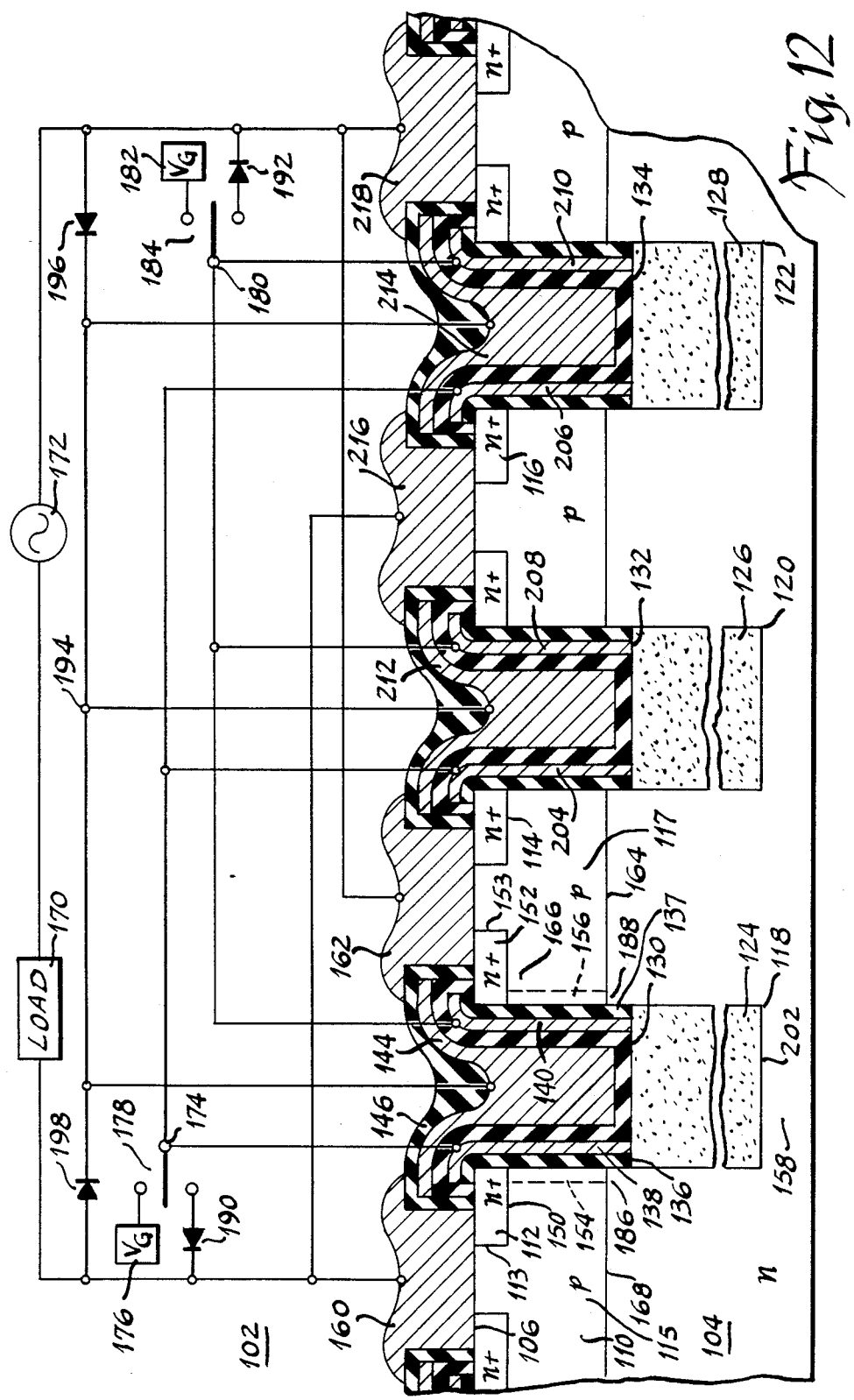

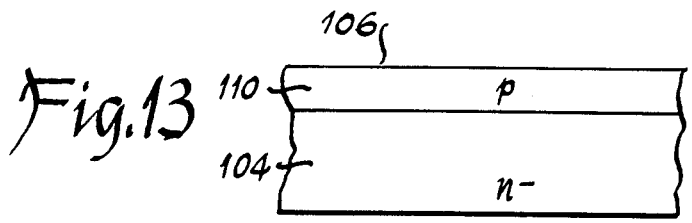
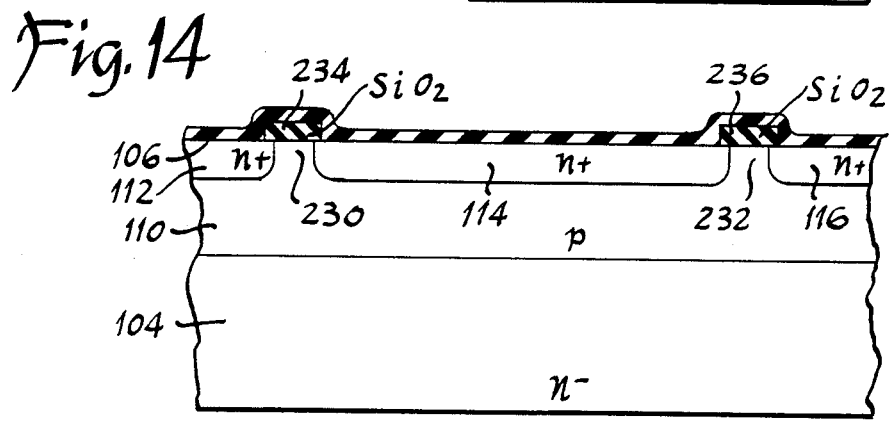
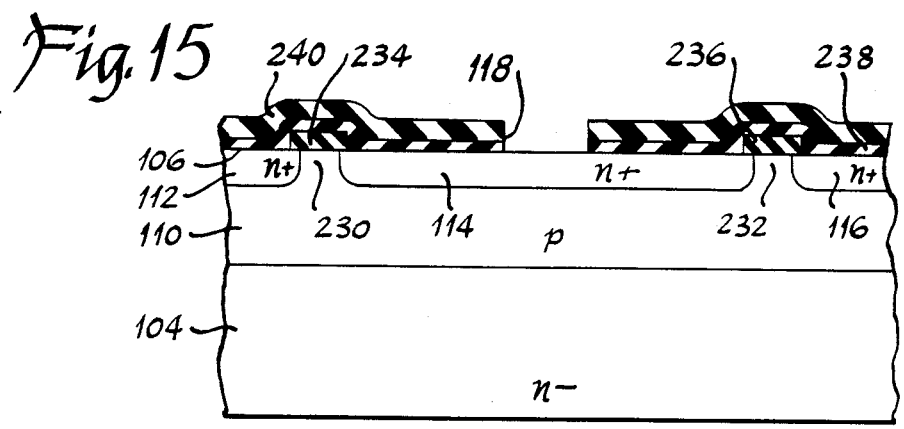
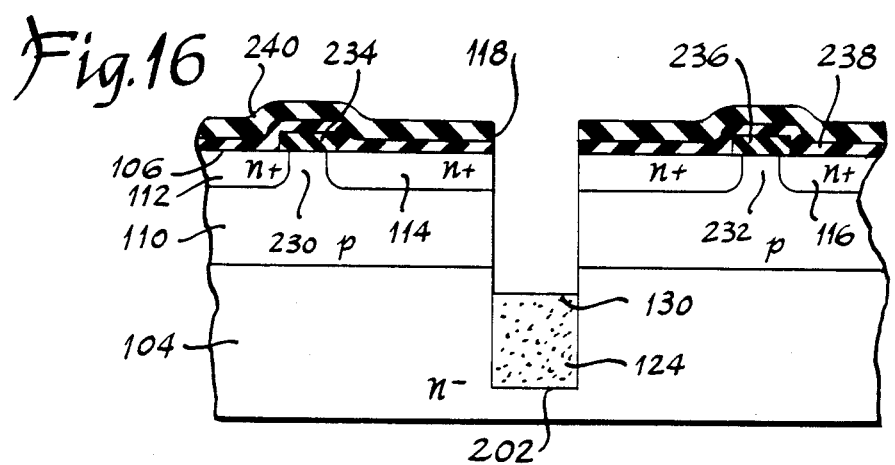

LATERAL BIDIRECTIONAL SHIELDED NOTCH FET

TECHNICAL FIELD

The invention relates to power switching semiconductors, and more particularly to power MOSFETs (metal oxide semiconductor field effect transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e. it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e. resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOSFET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $R_{on}=kV_B^{2.6}$ ohm-cm$^2$ where $R_{on}$ is the ON state resistance, k is a constant ($3.7\times10^{-9}$), and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ED-26, pages 243-244, 1979.

SUMMARY

The present invention provides lateral power FET structure which is bidirectional, i.e. current can flow in either direction when the device is in the ON state, whereby to afford AC application.

A notch gate structure is provided with a shielding electrode to afford increased OFF state voltage blocking capability, including non-floating gate implementations.

A notch extends downwardly from a top major surface to separate right and left source regions and right and left channel regions, and direct the drift region current path between the channels around the bottom of the notch. First and second gate electrodes are provided along opposite sides of the notch proximate the channels for controlling bidirectional conduction.

A shielding electrode is insulated between the first and second gate electrodes. In the OFF state, the shielding electrode shields the right notch edge drift region portion from electric field gradients from the left gate electrode. This prevents the left gate electrode from causing attraction of given polarity carriers in the drift region towards the right edge of the notch, which in turn prevents unwanted notch edge drift region depletion and inducement of conduction channels. The shielding electrode likewise shields the left notch edge drift region portion from electric field gradients from the right gate electrode in the OFF state to prevent unwanted depletion and inducement of conduction channels in the drift region.

In a desirable aspect, the structure is suited to manufacture in a repetitive multi-cell matrix array, affording plural FET integrated structure.

BRIEF DESCRIPTION OF THE DRAWINGS

Prior Art

FIGS. 1 through 11 show prior art.

FIG. 1 is a schematic cross-sectional view of a VMOS FET.

FIG. 2 is a schematic cross-sectional view of a DMOS FET.

FIG. 3 is a schematic cross-sectional view of a VMOS FET with a polysilicon gate.

FIG. 4 is a schematic cross-sectional view of a DMOS FET with a polysilicon gate (HEXFET).

FIG. 5 shows a top view of the structure of FIG. 4, illustrating the HEX outline.

FIG. 6 is a schematic cross-sectional view of a SIPMOS FET.

FIGS. 7 through 10 schematically illustrate the process steps yielding the structure of FIG. 6.

FIG. 11 is a schematic cross-sectional view of a lateral MOSFET.

Present Invention

Figure 17:
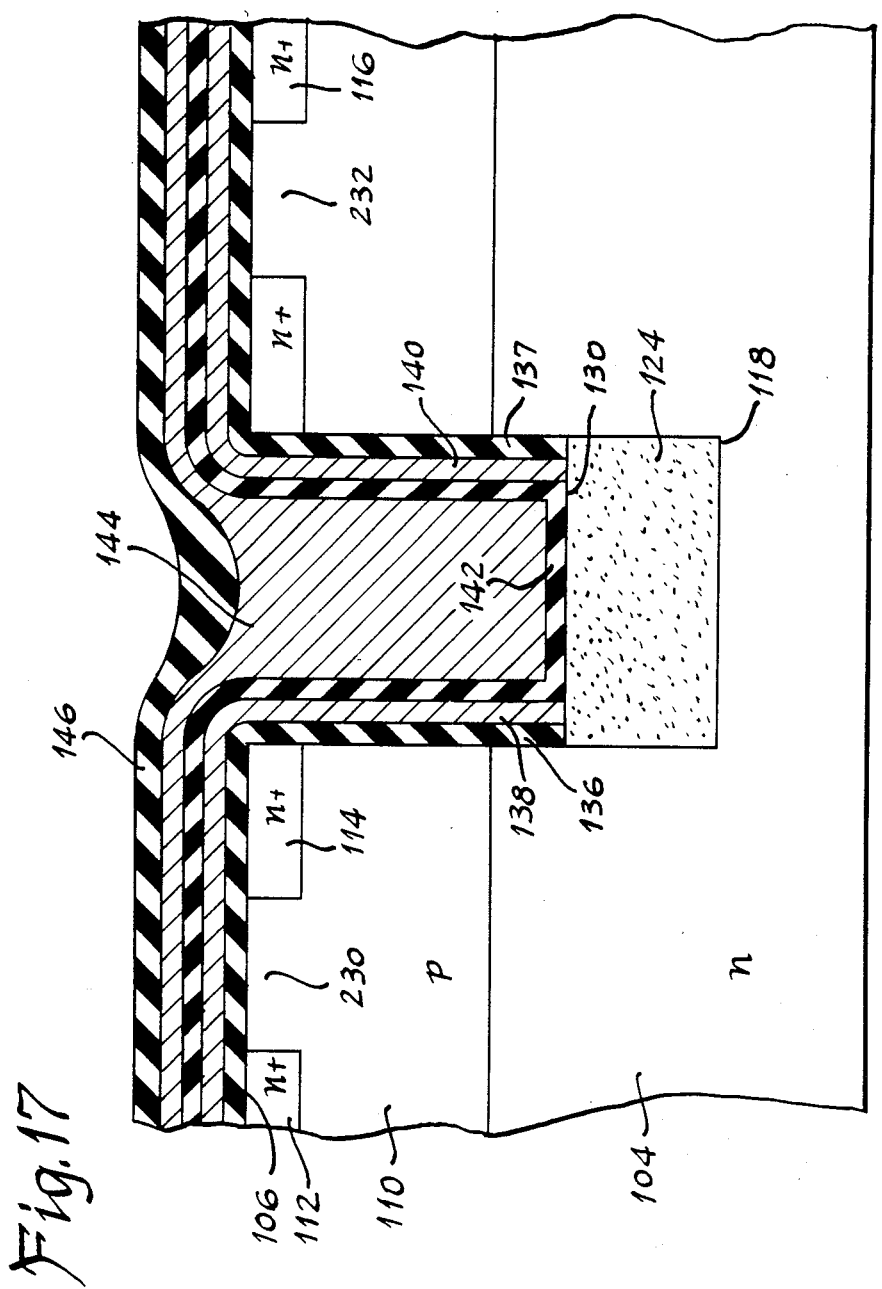

FIG. 12 is a schematic sectional view of FET structure constructed in accordance with the invention.

FIGS. 13 through 17 show the preferred processing of the invention.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

A cross-sectional view of a typical non-planar vertical device is illustrated in FIG. 1, showing a VMOS structure 2. The starting material is an n+ silicon wafer 4 with an n- epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs", C. Hu, IEEE Electron Device Conference, paper CH1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907-914.

An alternative configuration is the DMOS (double diffused metal oxide semiconductor) FET 24, FIG. 2. N+ starting material 26 has an n- epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 85% that of the vertical depth.

Stability of the operating specifications in MOS devices involves control of their threshold voltages, i.e. the value of the gate voltage required to produce the onset of drain to source conduction. This parameter is strongly influenced by the surface conditions of the silicon just over the channel region and the purity of the silicon dioxide, $SiO_2$ such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any Na+ ions in the oxide tend to reduce the threshold of n channel devices, and an overabundance of them can prevent turn-off altogether. If aluminum gate metal is placed directly into the gate oxide, these ions, if present in the aluminum, can drift into the silicon dioxide and degrade the device performance. This is true for VMOS, UMOS, and DMOS devices.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Another vertical planar unit is the SIPMOS structure shown in FIG. 6. An n- epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrochloric acid. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

As with the previously mentioned vertical MOSFETs, the lateral MOSFET 62 of FIG. 11 is unidirectional.

Device 62 is subject to the above noted trade-off between lateral length of the drift region 80 (i.e. the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is unidirectional in that only one junction drop separates drain and source when (for the n channel devices shown) the drain is negative with respect to the source. In many applications, these devices can be effectively employed. But if AC line voltage is to be the drain-source driving function, then a bidirectional design becomes mandatory. Again, inspection of the device geometries in FIGS. 1 through 11 shows that the reason for the unidirectional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bidirectional FET would result. There would be considerable asymmetry would due to unequal blocking capabilities of the n region 6 and p region 8. Likewise in FIG. 11, if a separate electrode is provided for p region 66 and if source metalization 74 contacted only source region 68, then a bidirectional FET would result, but there would be considerable asymmetry due to the unequal blocking capabailities of n region 64 and p region 66. Thus a new geometry and perhaps technology would be required.

Though not limited thereto, the present invention evolved from efforts to provide bidirectionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

FIG. 12 schematically shows lateral bidirectional power FET structure constructed in accordance with the invention. FET structure 102 includes a substrate 104 of one conductivity type having a top major surface 106. A p layer 110 is diffused into the substrate from top major surface 106, or grown, to a predetermined depth forming a first top layer. A second top layer 112 is formed in first top layer 110 by diffusion from top major surface 106 to a given depth. A plurality of laterally spaced second top layers 112, 114, 116 and so on, are provided by n+ regions.

A plurality of notches 118, 120, 122 and so on, are formed in the substrate from top major surface 106 through respective n+ regions 112, 114, 116 and so on, and through top layer 110 into substrate region 104. These notches may be anisotropically etched, as known in the art: C. Hu, "A Parametric Study of Power MOSFETs", IEEE Electron Device Conference, paper CH 1461-3/79, 0000-0385; IEEE Transactions Electron Devices, Volume ED-25, #10, October 1978; and Ammar and Rogers, "UMOS Transistors on Silicon", Transactions IEEE, ED-27, pages 907-914, May 1980. Alternatively, the notches may be formed by a porous silicon region in accordance with the known anodization technique of passing a fixed current through the localized region in the presence of concentrated hydrogen floride to create a structural change in the silicon which remains single crystalline with the substrate but becomes porous. In the case of anisotropic etching, the bottom of the notch is filled with insulative material. In the case of anodization, the substrate is subjected to an oxidizing atmosphere such that the oxygen enters the pores in the porous notched regions and rapidly oxidizes these regions as shown at 124, 126, 128 and so on, which regions are still single crystalline with substrate 104 but substantially non-conductive. Before or after the anodization, the notches are etched down to levels 130, 132, 134 and so on.

In notch 118, silicon dioxide insulating layers 136 and 137 are grown along the inner facing surfaces of the notch. First and second gate electrodes 138 and 140 are then formed along the left and right vertical sides of the notch, as by shadow sputtering of conductive material such as aluminum from an angle. Another insulating oxide layer 142 is provided along the facing sides of the gate electrodes and along the bottom of the upper notch section, as by chemical vapor deposition. Shielding electrode means 144 is then deposited in the notch and is insulated between the gate electrodes by insulating layer 142. Another oxide layer 146 is then deposited over the shielding electrode 144. The insulated gating and shielding structure in notches 120 and 122 is comparable.

Notch 118 extends from top major surface 106 downwardly through second top layer 112 and first top layer 110 into substrate region 104. Notch 118 separates the second top layer 112 into first and second left and right source regions 150 and 152 and extends therebetween. Notch 118 separates the first top layer 110 into first and second regions 115 and 117 having left and right channel regions 154 and 156 and extends therebetween. The substrate region 104 around the notch forms a drift region 158 of the substrate.

Main electrode metallization 160 is deposited on top major surface 106 to ohmically contact source region 150 and p layer region 115. Another main electrode metallization 162 is deposited on top major surface 106 to ohmically contact source region 152 and p layer region 117.

Upon application of a positive voltage to gate electrode 138 with respect to electrode 160, electrons in p region 115 are attracted to channel region 154 to invert the conductivity type therein to n type. If main electrode 162 is positive with respect to main electrode 160, current may then flow from p region 117 momentarily across a forward biased pn junction 164 into drift region 158, then through channel 154 to source region 150 and electrode 160. As soon as current starts to flow through the FET, the voltage across main electrodes 162 and 160 drops, which in turn reduces the potential in various regions of the FET, including portion 166 of p layer region 117 adjacent the right FET channel 156. This falling potential causes carrier electron flow into channel region 156 because portion 166 becomes negative relative to right gate electrode 140 at a given gate potential, whereby positive right gate electrode 140 attracts electrons into right channel region 156 to invert the conductivity type thereof to n type, and hence render channel 156 conductive. Forward biased pn junction 164 thus conducts only momentarily until the second channel 156 turns on.

The main current path through FET 102 is from main electrode 162 through source region 152, downwardly through vertical channel region 156 along the right side of notch 118, then further downwardly into drift region 158 along the right side of the notch, then around the bottom of notch 118, then upwardly along the left side of notch 118 in drift region 158 of substrate 104, then upwardly through vertical channel region 154 along the left side of notch 118, then through source region 150 to main electrode 160.

The structure is bilateral, and thus current may also flow from main electrode 160 to main electrode 162 when gate 140 is positive with respect to electrode 162. Electrons in p layer 117 are attracted into channel region 156 by gate 140 to thus invert channel region 156 to n type and hence allow electron flow from n+ source region 152 through channel 156 into drift region 158 in substrate 104. If main electrode 160 is positive with respect to main electrode 162, current then flows from p layer region 115 momentarily across forward biased pn junction 168 until channel 154 turns on. The main current path is from main electrode 160 through source 150, through channel 154, through drift region 158, through channel 156, through source 152 to main electrode 162. Main electrode 162 thus serves as an electron current source when a negative voltage is applied thereto relative to the voltage on main electrode 160, and serves as an anode when a positive voltage is applied thereto relative to the voltage on main electrode 160.

The application of electrical gate potential to gate electrodes 138 and 140 enables them to produce electric fields of sufficient intensity to invert the conductivity type in the first and second channel regions 154 and 156. Upon application of voltage of either polarity to the first and second source regions 150 and 152, electric current can flow in a respective corresponding direction between them, under control of the electrical gate potential of the gate electrode means 138 and 140. The current flow between spaced apart regions 150 and 152 is controllable by controlling the electric fields in channel regions 154 and 156, which in turn are controllable by controlling the electric potential on the gate electrode means 138 and 140.

In the absence of gate potential on gate electrodes 138 and 140, channel regions 154 and 156 are p type, and the device is in a blocking OFF state. Current from main electrode 160 to main electrode 162 is blocked by junction 164. Current flow in the other direction from main electrode 162 to main electrode 160 is blocked by junction 168.

Bidirectional FET 102 may be used to control AC power. FIG. 12 schematically shows a load 170 and a source of AC power 172 connected across main electrodes 160 and 162. Gate electrode 138 is connected by a gate terminal 174 to a source of gate potential 176 through switch means 178. Gate electrode 140 is connected by a gate terminal 180 to a source of gate potential 182 through switch means 184. In the ON state of FET 102, switches 178 and 184 are in an upward position such that given polarity gate potential is applied to gate electrodes 138 and 140. The gate potential is higher than the most negative of the main electrodes in each half cycle.

When main electrode 162 is positive with respect to main electrode 160, as driven by AC source 172, gate electrodes 138 is positive with respect to electrode 160 connected to source region 150 and p layer region 115. Hence, channel 154 is inverted to n type and conduction occurs, i.e., current flows from positive main electrode 162 through source region 152, through channel 156, through drift region 158 around the bottom of notch 118 in substrate 104, through channel 154, through source 150 to negative main electrode 160 and through load 170.

In the other half cycle of the AC source 172, main electrode 160 is positive with respect to main electrode 162, and gate electrode 140 is positive with respect to negative main electrode 162 connected to source 152 and p layer region 117. Conduction is thus enabled through channel 156, and current flows from positive main electrode 160 through source 150, through channel 154, through drift region 158 around the bottom of notch 118 in substrate 104, through channel 156, to source 152 and main electrode 162.

Shielding electrode means 144 prevents electric field gradient induced depletion in drift region portions 186 and 188, which in turn prevents unwanted inducement of conduction channels in the drift region during the OFF state. This enables the use of non-floating gates, i.e. the referencing of gate electrodes 138 and 140 to the same potential level of one or more of the main electrodes in the OFF state of FET 102. In the OFF state of FET 102, switches 178 and 184 are in the downward position, connecting gate terminal 174 through reverse blocking diode 190 to main electrode 160, and connecting gate terminal 180 through reverse blocking diode 192 to main electrode 162.

In the OFF state of FET 102 and during the first half cycle of AC source 172, the voltage on main electrode 162 rises positively with respect to main electrode 160. Junction 164 is forward biased and thus the potential level in the drift region 158 of substrate 104 is at substantially the same level as electrode 162. Left gate electrode 138 is relatively negative since it is tied through diode 190 to electrode 160 and the other side of the AC source. There is thus an electric field gradient established between right region 188 and the left gate electrode 138. The potential level along the left side of notch 118 in substrate 104 is at a very low level and increases as one moves vertically downwardly along the left edge of notch 118. The electric field gradient between the left and right edges of notch 118 causes attraction of given polarity carriers from substrate 104 into region 188.

As the positive voltage on electrode 162 rises higher, drift region portion 188 becomes more positively biased relative to gate electrode 138, and the electric field gradient causes attraction of holes toward, and depletion of electrons away from, drift region portion 188. If the carrier concentration becomes great enough, the conductivity type of portion 188 is inverted to p type such that conduction occurs through an induced p channel along portion 188 around notch 118. A conduction channel is thus formed around to the left side of the notch and junction 168 loses its reverse blocking ability, whereby FET 102 can no longer block voltage in its OFF state from source 172.

Shielding electrode 144 is connected by terminal 194 through reverse blocking diode 196 to main electrode 162 to be at the same potential level thereof. As the potential of main electrode 162 and thus substrate region 104 and drift region portion 188 rises, so also does shielding electrode 144. Shielding electrode 144 is insulated between gate electrode 138 and drift region portion 188 to thus shield the latter from the electric field gradient of the gate electrode 138. Shield 144 thus prevents an electric field gradient from being established at drift region portion 188, whereby to prevent attraction of holes to the right edge of notch 118 at portion 188 below junction 164. As the potential level in drift region portion 188 rises, so does the potential level of shield 144, whereby the relatively negative gate electrode 138 no longer affects the conductivity characteristics of drift region portion 188. Shield 144 thus prevents unwanted inducement of conduction channels in the drift region during the OFF state.

During the second half cycle of source 172, and during the OFF state of FET 102, main electrode 160 rises positively with respect to main electrode 162. Shield electrode 144 is connected by terminal 194 through reverse blocking diode 198 to main electrode 160 and thus rises positively therewith. As the potential of main electrode 160 becomes greater, so does the potential level of drift region portion 186 of substrate 104 due to the single junction drop thereto across junction 168. This potential rises positively with respect to gate electrode 140 which is connected to negative main electrode 162 through diode 192. If the applied voltage becomes great enough, the relatively negative gate electrode 140 would establish a large enough electric field gradient across notch 118 to effect conductivity inversion and induce a conduction channel in drift region portion 186. Shield 144 prevents this unwanted inducement of conduction channels during the OFF state in the drift region. Shield electrode 144 is between gate electrode 140 and drift region portion 186 and is at substantially the same potential level as main electrode 160, and thus shields drift region portion 186 from any electric field gradient caused by gate electrode 140.

In preferred form, the gate electrode and shield electrode structure does not extend down too far into drift region 158 within insulator notch 118. This further prevents unwanted inducement of conduction channels in the OFF state, which in turn affords yet higher OFF state voltage blocking capability.

As above, in the OFF state, if the voltage on main electrode 162 is positive with respect to main electrode 160, and if gate electrode 138 is referenced to electrode 160, then as the positive voltage on main electrode 162 rises higher, the potential in substrate 104 likewise rises positively with respect to gate electrode 138 because of the single forward junction drop across pn junction 164. Gate electrode 138 thus becomes more negative relative to drift region 158 in substrate 104. If the gate electrode extends down within insulative region 124, the gate electrode would attract holes toward the edges of insulative region 124 along the sides of notch 118. If the concentration of carrier holes along the sides of the notch becomes great enough, then conductivity inversion to p type may occur along these sides. This inducement of conduction channels enables conduction from the p region 117 below electrode 162 through the induced p type conduction channel in drift region 158 around the notch then to the p region 115 below electrode 160.

The preferred structure of the gate electrode and shield electrode means in FIG. 12 provides increased spacing of the gate electrodes above the bottom 202 of the notch, and substantially diminishes the attractive force on carrier holes toward the edges of the notch. This enables higher OFF state voltage blocking capability, even in non-floating gate implementations. It is preferred that notch 118 extends downwardly into drift region 158 a substantial distance below gate electrodes 138 and 140 and shielding electrode 144. It is preferred that electrodes 138, 140 and 144 extend downwardly to about the depth of junctions 164 and 168.

Higher OFF state voltage blocking capability is further afforded by the increased drift region current path length. The current path between the main electrodes extends from each source region downwardly through the channel regions and downwardly and around the bottom 202 of the notch. This increases the drift region current path length and affords higher OFF state voltage blocking capability without increasing the lateral dimension along the top major surface 106, whereby to afford high density, high voltage bidirectional FET structure.

As seen in FIG. 12, a plurality of FETs are afforded in the integrated structure. N+ regions or top layers 114 and 116, are likewise split and separated into laterally spaced first and second source regions along top major surface 106 by respective notches 120 and 122. Main electrode metallizations are provided comparably to that described, and connected in series in the AC load line, or in parallel as shown in FIG. 12. Left gate electrodes 204 and 206 are connected in parallel with gate electrode 138 to gate terminal 174. Right gate electrodes 208 and 210 are connected in parallel with gate electrode 140 to gate terminal 180. Shielding electrodes 212 and 214 are connected in parallel with shielding electrode 144 to terminal 194.

Main electrode 162 provides the source electrode for the FET to the left around notch 118, and also provides the source electrode for the FET to the right around notch 120. Main electrode 216 provides the drain electrode for the FET around notch 120, and also provides the drain electrode for the FET around notch 122. In the other half cycle of AC source 172, the roles of electrodes 162 and 216 are reversed, i.e. electrode 162 is the drain for its left and right FETs around respective notches 118 and 120, and electrode 216 is the source for its left and right FETs around respective notches 120 and 122. Alternate electrodes 160, 216 and so on are thus connected to one side of the AC source, and the other alternate electrodes 162, 218 and so on are connected to the other side of the AC source.

There is thus shown a lateral bidirectional shielded notch FET, including: a first source region 150 of one conductivity type; a first channel region 154 of opposite conductivity type forming a junction 113 with first source region 150; a drift region 158 of the one conductivity type forming another junction 168 with the first channel region 154; a second channel region 156 of the opposite conductivity type forming a junction 164 with drift region 158; a second source region 152 of the one conductivity type forming a junction 153 with second channel region 156; a notch 118 extending between and separating the first and second source regions 150 and 152 and the first and second channel regions 154 and 156, and extending into drift region 158 in substrate 104; first insulated gate means 138 in notch 118 proximate first channel 154 and adapted for application of electrical potential for producing electric fields of sufficient intensity to invert the conductivity type in first channel region 154; second insulated gate means 140 in notch 118 proximate the second channel 156 and adapted for application of electrical potential for producing electric fields of sufficient intensity to invert the conductivity type in the second channel region 156; shielding means 144 in notch 118 insulated between the first and second gate means 138 and 140 for preventing electric field gradient induced depletion in drift region portions 186 and 188 along the edges of notch 118; whereby upon application of voltage of either polarity to the first and second source regions 150 and 152 electric current can flow in a respective corresponding direction between them, under control of the electrical potential of the gate means, the conductive current path through drift region 158 traversing along one side of notch 118 then around the bottom end 202 thereof then along the other side of notch 118, and such that in the absence of electric gate potential, shielding means 144 prevents unwanted inducement of conduction channels in drift region 158.

FIGS. 13 through 17 show the preferred processing of the invention. Starting with a lightly doped n− substrate 104 in FIG. 13, for example having a donor density of about $6 \times 10^{14}$ donor atoms per cubic centimeter, p type epitaxial layer 110 is provided with boron at a density of about $1 \times 10^{17}$ donor atoms per cubic centimeter, and having a depth of about 3 microns. A layer of silicon dioxide $SiO_2$ is then grown on the top surface 106, followed by masking and exposing to define p areas 230 and 232, FIG. 14, followed by arsenic deposition and diffusion to provide n+ regions 112, 114, 116 and so on, to a depth of about 1 micron and having a surface concentration of $1 \times 10^{21}$. Regions 234 and 236 are the silicon dioxide areas remaining after the masking and exposure etching. During the arsenic diffusion, another silicon dioxide layer 238 forms over the top surface.

Next, a silicon nitrite $Si_4N_3$ layer 240 is deposited to a thickness of about 4 microns, to provide a high quality insulating material and a mask definition material. The silicon nitrite layer 240 is plasma etched down to top major surface 106, forming hole 118, FIG. 15. A porous silicon region 124 is formed by anodization in the presence of hydrogen floride as above. Contacts are placed on the top and bottom surfaces, and since silicon nitrite layer 240 is an insulator, current will only pass through the notch hole 118 to thus provide selective anodization through vertical region 124. A structural change is created in the silicon which remains single crystalline with substrate 104 but becomes porous. The depth of porous silicon region 124 at bottom edge 202 below top major surface 106 is about 15 microns. Before or after the anodization, the notch is etched down to level 130, FIG. 16, about 4 microns below top major surface 106.

The silicon nitrite layer 240 is removed by etching and the substrate is subjected to an oxidizing atmosphere such that the oxygen enters the pores in porous region 124 and rapidly oxidizing region 124 rendering it substantially nonconductive.

After the oxidation, silicon dioxide layers 136 and 137 remain, FIG. 17. The porous silicon region 124 oxidizes much faster than the growth of the silicon dioxide layers whereby to afford process control enabling the gate oxide insulating layers along channels 154 and 156 along the vertical walls of the notch hole 118. Gate electrodes 138 and 140 are then deposited, for example by shadow sputtering at an angle across each side of the notch. Insulating layer 142 is then provided by slow growth chemical vapor deposition. Shielding electrode 144 is provided by deposition preferably of titanium disilicide which is conductive. The top insulating silicon dioxide layer 146 is then grown. The substrate is then masked and etched again over areas 230, 232 and so on, followed by aluminum metalization sputtered or deposited in the open areas, resulting in main electrodes 160, 162, 216, 218 and so on, FIG. 12.

It is recognized that various modifications are possible within the scope of the appended claims.

We claim:

1. A bidirectional FET, comprising in a semiconductor substrate:

a first source region of one conductivity type semiconductor material;

a first channel region of opposite conductivity type semiconductor material forming a junction with said first source region;

a single drift region of one conductivity type semiconductor material forming another junction with said first channel region;

a second channel region of said opposite conductivity type semiconductor material forming a junction with said drift region;

a second source region of said one conductivity type semiconductor material forming a junction with said second channel region;

a notch extending between and separating said first and second source regions and said first and second channel regions, and extending into said drift region;

first insulated gate means in said notch proximate said first channel region and adapted for application of an electrical potential for producing electric fields of sufficient intensity to invert the conductivity type in said first channel region;

second insulated gate means in said notch proximate said second channel region and adapted for application of an electrical potential for producing electric fields of sufficient intensity to invert the conductivity type in said second channel region;

said single drift region forming first and second PN junctions with respective said first and second channel regions, said first and second source regions forming third and fourth PN junctions with respective said first and second channel regions;

a first main electrode contacting said first source region and said first channel region;

a second main electrode contacting said second source region and said second channel region;

a source of alternating voltage impressed across said first and second main electrodes such that during the first half cycle of said alternating voltage said first PN junction is a forward biased junction and said second PN junction is a reverse biased junction, and such that during the second half cycle of said alternating voltage said second PN junction is a forward biased junction and said first PN junction is a reverse biased junction;

a first gating voltage source connected to said first gate means in said second half cycle of said alternating voltage to create a first inversion channel region between said single drift region and said first source region to short the otherwise blocking reverse biased said first PN junction during said second half cycle of said alternating voltage such that current flows through said FET from said second main electrode to said first main electrode during said second half cycle of said alternating voltage;

a second gating voltage source connected to said second gate means in said first half cycle of said alternating voltage to create a second inversion channel region between said single drift region and said second source region to short the otherwise blocking reverse biased said second PN junction during said first half cycle of said alternating voltage such that current flows through said FET from said first main electrode to said second main electrode during said first half cycle of said alternating voltage;

said FET having an OFF state in the absence of said gating electrical potential from said first and second gating voltage sources, said single drift region supporting OFF state blocking voltage in both directions, and wherein said first and second gate means are at non-common potentials in said OFF state;

shielding means in said notch insulated between said first and second gate means for preventing electric field gradient induced depletion in said drift region along said notch in said OFF state, to prevent unwanted inducement of conduction channels;

means connecting said shielding means to said main electrodes in said OFF state such that the potential of said shielding means is substantially the same as the potential in said drift region along the edge of said notch below the respective said channel region in said OFF state such that said shielding means shields said last mentioned notch edge drift region portion from electric field gradients from the gate means along the opposite notch edge and prevents attraction of given polarity carriers in said drift region towards the edges of said notch and prevents electric field gradient induced depletion and unwanted inducement of conduction channels in said drift region during said OFF state.

2. The invention according to claim 1 wherein said channel regions are laterally spaced by said notch, and said notch extends vertically downwardly from a top major surface of said FET, said channel regions extending generally vertically along respective sides of said notch, said drift region being below said channel regions, two junctions being mesa stacked on each side of said notch, a first side of said notch having said junction between said first source region and said first channel region and said junction between said first channel region and said drift region, a second side of said notch having said junction between said second source region and said second channel region and said junction between said second channel region and said drift region.

3. The invention according to claim 2 wherein said source regions are laterally spaced along said top major surface by said notch therebetween, said source regions being above respective said channel regions.

4. A bidirectional FET, comprising:

a first source region of one conductivity type semiconductor material;

a first channel region of opposite conductivity type semiconductor material forming a junction with said first source region;

a single drift region of one conductivity type semiconductor material forming another junction with said first channel region;

a second channel region of said opposite conductivity type semiconductor material forming a junction with said drift region;

a second source region of said one conductivity type semiconductor material forming a junction with said second channel region;

a notch extending between and separating said first and second source regions and said first and second channel regions, and extending into said drift region;

first insulated gate means in said notch proximate said first channel region and adapted for application of an electrical potential for producing electric fields of sufficient intensity to invert the conductivity type in said first channel region;

second insulated gate means in said notch proximate said second channel region and adapted for application of an electrical potential for producing electric fields of sufficient intensity to invert the conductivity type in said second channel region;

whereby upon application of voltage of either polarity to said first and second source regions, electric current can flow in a respective corresponding direction between them, under control of said electrical potential of said gate means, the conductive current path through said drift region traversing along one side of said notch then around the end thereof then along the other side of said notch, and such that in the absence of said electric gate potential, said FET is in an OFF state blocking current flow in both directions, said single drift region around said notch supporting OFF state blocking voltage in both directions; and shielding means in said notch insulated between said first and second gate means for preventing electric field gradient induced depletion in said drift region along said notch in said OFF state, to prevent unwanted inducement of conduction channels;

wherein said channel regions are laterally spaced by said notch, and said notch extends vertically downwardly from a top major surface of said FET, said channel regions extending generally vertically along respective sides of said notch, said drift region being below said channel regions, two junctions being mesa stacked on each side of said notch, a first side of said notch having said junction between said first source region and said first channel region and said junction between said first channel region and said drift region, a second side of said notch having said junction between said second source region and said second channel region and said junction between said second channel region and said drift region;

wherein said source regions are laterally spaced along said top major surface by said notch therebetween, said source regions being above respective said channel regions; and comprising:

a pair of main electrodes each connected to a respective said source region;

said first insulated gate means comprising first insulation layer means on an inner surface of said notch along said first channel region, and first gate electrode means in said notch extending along said first insulation layer means such that said first gate electrode means extends in close proximity along and insulated from said first vertical channel region; and said second insulated gate means comprising second insulation layer means on an inner surface of said notch along said second channel region, and second gate electrode means in said notch along said second insulation layer means such that said second gate electrode means extends in close proximity along and insulated from said second vertical channel region;

wherein said FET has an OFF state in the absence of said electric gate potential, with the junction between said drift region and one of said channel regions blocking current flow toward one of said main electrodes, and with the junction between said drift region and the other of said channel regions blocking said current flow toward the other of said main electrodes;

wherein the drift region current path between said main electrodes extends from said source regions downwardly through said channel regions and downwardly and around the bottom of said notch so as to increase the drift region current path length and afford higher OFF state blocking voltage capability, without increasing the lateral dimension along said top major surface, whereby to afford a high density, high voltage bidirectional FET structure;

wherein each of said first and second gate electrode means is referenceable to a common potential level with a respective one of said main electrodes in said OFF state of said FET, said shielding means being referenceable to said main electrodes such that in said OFF state the potential of said shielding means is substantially the same as the potential in said drift region along the edge of said notch below the respective channel region, whereby said shielding means shields said last mentioned notch edge drift region portion from electric field gradients from the gate electrode means along the opposite notch edge, to thus prevent attraction of given polarity carriers in said drift region towards the edges of said notch, to prevent electric field gradient induced depletion and hence prevent unwanted inducement of conduction channels in said drift region during said OFF state;

wherein said notch extends downwardly into said drift region a substantial distance below each of said first and second gate electrode means.

5. The invention according to claim 4 wherein said notch extends downwardly into said drift region to a depth substantially below said channel regions, and said first and second gate electrode means extend downwardly to about the depth of said junctions between said channel regions and said drift region.

6. A lateral power FET comprising:

a substrate of semiconductor material including a lateral n layer;

a p type layer on said lateral n layer;

an n type region embedded in said p type layer;

a notch extending vertically downwardly through said n type region, through said p type layer, and into said n layer to define a vertical plane along mesa stacked said n layer, said p type layer and said n type region;

first insulated gate means disposed in said notch in close proximity to and insulated from the generally vertical region in said p type layer on a first side of said notch, and adapted for application of electrical gate potential for producing controllable electric fields in said last mentioned vertical region;

second insulated gate means disposed in said notch in close proximity to and insulated from the generally vertical region in said p type layer on a second side of said notch, and adapted for application of electrical gate potential for producing controllable electric fields in said last mentioned vertical region;

shielding means in said notch insulated between said first and second gate means for preventing electric field gradient induced depletion in said n layer along said notch below said p type layer;

a pair of main electrodes each conductively communicating with a respective one of said embedded n type regions on opposite sides of said notch for serving as an electron current source when a negative voltage is applied to one of said main electrodes relative to the voltage on the other of said main electrodes, and serving as an anode when a positive voltage is applied to said one main electrode relative to the voltage on said other main electrode;

whereby upon application of voltage of either polarity to said main electrodes, current flow in either direction between said embedded n type regions on opposite sides of said notch is controllable by controlling said potential on said gate means, and such that in the absence of said electric gate potential, said shielding means prevents unwanted inducement of conduction channels through said n layer along the edge of said notch;

wherein the conductive current path through said substrate extends generally vertically along opposite sides of said notch and around the bottom thereof so as to increase the drift region path length through said n layer of said FET without increasing the lateral dimension, whereby to afford higher voltage blocking capability in a smaller lateral area;

wherein said shielding means comprises shielding electrode means referenceable to the same potential level as said main electrodes, and wherein each of said first and second gate means is referenceable in an OFF state to the same potential level as the respective one of said main electrodes, such that in an OFF state said shielding electrode means shields the portion of said n layer along said second side of said notch from said first gate means, and shields the portion of said n layer along said first side of said notch from said second gate means, to prevent electric field gradient induced depletion in said n layer along the edges of said notch below said p layer;

wherein said notch extends downwardly into said n layer a substantial distance below said first and second gate means to substantially diminish attraction of holes by said gate means from said n layer toward the edges of said notch, to further prevent unwanted inducement of conductive p channels between said p layers on opposite sides of said notch in an OFF state of said FET, to afford increased OFF state voltage blocking capability.

7. The invention according to claim 6 wherein said notch extends downwardly into said n layer to a depth substantially below said p layers on opposite sides of said notch, and said first and second gate means and said shielding electrode means extend downwardly into said notch to about the depth of the junctions between said p layers and said n layer.

8. The invention according to claim 7 wherein the portion of said notch below said first and second gate means and said shielding electrode means comprises anodized single crystalline porous silicon oxidized to a substantially insulative condition.

9. A bidirectional lateral power FET, comprising:
a substrate of semiconductor material of one conductivity type having a top major surface;
a pair of channel regions of the other conductivity type laterally spaced in said substrate;
a pair of source regions of said one conductivity type laterally spaced along said top major surface and each forming a junction with a respective one of said channel regions;
a notch in said substrate extending downwardly from said top major surface between said source regions and said channel regions into a single drift region in said substrate, such that the conductive current path is directed from one source region downwardly through a generally vertical one said channel region along one side of said notch, then further downwardly into said drift region along said one side of said notch, then around the bottom of said notch, then upwardly along the other side of said notch in said drift region, then upwardly along a generally vertical other said channel region to said other source region, with the same path conducting current in the reverse direction from said other source region to said one source region, said single drift region around said notch supporting OFF state blocking voltage in both directions;
a pair of main electrodes connected respectively to said source regions;
first insulated gate electrode means in said notch proximate the first said generally vertical channel region for attracting given polarity carriers to invert said first channel region to said one conductivity type in response to given gate potential, such that current may flow in a first direction between said main electrodes;
second insulated gate electrode means in said notch proximate the second said generally vertical channel region for attracting given polarity carriers to invert said second channel region to said one conductivity type in response to given gate potential, such that current may flow in a second direction between said main electrodes;
wherein said notch extends downwardly into said drift region a substantial distance below said gate electrode means to substantially diminish attraction of carriers by said gate electrode means from said drift region toward the edges of said notch, to further prevent unwanted inducement of conduction channels in said OFF state of said FET and afford higher OFF state voltage blocking capability.

10. The invention according to claim 9 wherein said notch extends downwardly into said drift region to a depth substantially below said channel regions, and said first and second gate electrode means extend downwardly to about the depth of said channel regions.

11. The invention according to claim 10 wherein the portion of said notch below said gate electrode means comprises anodized single crystalline porous silicon oxidized to a substantially insulative condition.

* * * * *